United States Patent [19]
Nichols

[11] Patent Number: 4,732,868
[45] Date of Patent: Mar. 22, 1988

[54] METHOD OF MANUFACTURE OF A UNIPHASE CCD

[75] Inventor: David N. Nichols, Fairport, N.Y.

[73] Assignee: Eastman Kodak Company, Rochester, N.Y.

[21] Appl. No.: 31,974

[22] Filed: Mar. 30, 1987

[51] Int. Cl.⁴ .................... H01L 21/425; H01L 29/78
[52] U.S. Cl. .......................................... 437/29; 437/53
[58] Field of Search ........................... 437/29, 30, 53

[56] References Cited

U.S. PATENT DOCUMENTS

| | | | |
|---|---|---|---|
| 4,027,381 | 6/1977 | Tasch, Jr. et al. | 437/53 X |
| 4,076,557 | 2/1978 | Huang et al. | 437/53 X |
| 4,167,017 | 9/1979 | Tasch, Jr. et al. | 357/24 |
| 4,229,752 | 10/1980 | Hynecek | 357/24 |
| 4,318,216 | 3/1982 | Hus | 437/29 |
| 4,364,076 | 12/1982 | Chatterjee et al. | 357/24 |
| 4,502,205 | 3/1985 | Yahano | 437/29 |
| 4,553,316 | 11/1985 | Houston et al. | 437/29 |
| 4,613,402 | 9/1986 | Losee et al. | 156/643 |

Primary Examiner—Olik Chaudhuri
Attorney, Agent, or Firm—Raymond L. Owens

[57] ABSTRACT

A method for fabricating a uniphase virtual electrode CCD uses only a single mask of different materials, portions of which are selectively removed, for a series of ion implantation steps. In this way, there is achieved the desired potential profile for the four sections of each cell without any need for aligning masks between successive implantation steps.

4 Claims, 7 Drawing Figures

METHOD OF MANUFACTURE OF A UNIPHASE CCD

FIELD OF INVENTION

This invention relates to semiconductor charge-coupled devices (CCDs) of the uniphase type, and more particularly to their manufacture.

BACKGROUND OF THE INVENTION

Uniphase CCDs are well known. See for example U.S. Pat. No. 4,229,752 which issued on Oct. 21, 1980. A uniphase CCD generally employs a continuous gate electrode over the signal channel made up of a series of cells and the mobile charge packets are transported between successive cells of the channel by a single-phase clock signal periodically applied to the continuous gate electrode. In a buried-channel CCD, the mobile charge is transported in an induced channel within the bulk of the semiconductor substrate rather than along the surface for improving the charge transfer efficiency.

In a uniphase CCD, each of the plurality of cells which forms the signal channel includes four sections, a first storage section, a first transfer section, a second storage section and a second transfer section. To ensure the desired unilateral transport of the charge packets along each cell, its four sections are designed to form potential wells of varying depth under control of different concentrations of dopants. Moreover, a portion of each cell needs to include an inversion layer at its interface with the overlying silicon oxide surface to function as a virtual electrode, shielding the underlying cell sections from any gate-induced change in potential.

As is known, for a high density CCD it is desirable to keep the length along the channel of each cell short. Moreover, for optimizing the storage efficiency of each cell, it is desirable to maximize the ratio of the length of the storage sections to the length of the transfer sections of each cell. The invention is useful for increasing this ratio.

Generally, the packing density of the cells in a CCD is limited by the resolution and alignment capabilities of the photolithographic apparatus used in patterning the various masking layers conventionally used in the processing of the CCD. The accuracy of alignment of successive masks employed also serves as a limiting factor. In the past, these factors have served to limit the optimum design that can be readily achieved in practical manufacture.

SUMMARY OF THE INVENTION

The present invention is directed to a method for making a buried-channel uniphase CCD which is relatively independent of the resolution capability of the photolithographic equipment used and essentially free of critical alignment steps.

To this end, the method of the present invention employs a single mask comprising for each cell a central portion of one masking material and on opposite sides of the central portion a pair of spacer portions of a different masking material. By successive elimination of different portions of the mask, the one mask shrunk in size can be used for successive ion implantation steps. There is, accordingly, eliminated the need for alignment of successive masks. Moreover, by controlling the dimensions of the length of the spacer portions in a manner that is independent of photolithography, the process is made relatively independent of photolithography and its limitations.

In one aspect this invention is directed to, in the manufacture of a uniphase charge coupled device, the process of providing a desired doping concentration in a semiconductive substrate for use in the charge-coupled device comprising the steps of:

(a) forming over the substrate a mask including a plurality of strip portions, each including a central portion of one material with vertical side walls and edge portions of a different material on opposite side walls of the central portion;

(b) implanting ions of one type through the mask into exposed regions of the substrate;

(c) removing corresponding ones of the edge portions of each strip;

(d) implanting ions of both the one and the opposite types into the exposed region of the substrate;

(e) removing the central portion of each strip;

(f) implanting ions of the one type into exposed regions of the substrate; and (g) removing the remaining edge portion of each strip.

BRIEF DESCRIPTION OF THE DRAWING

The invention will be better understood from the following more detailed description of an illustrative embodiment taken in conjunction with the accompanying drawing.

DESCRIPTION OF PREFERRED EMBODIMENTS OF THE INVENTION

Figure 1:
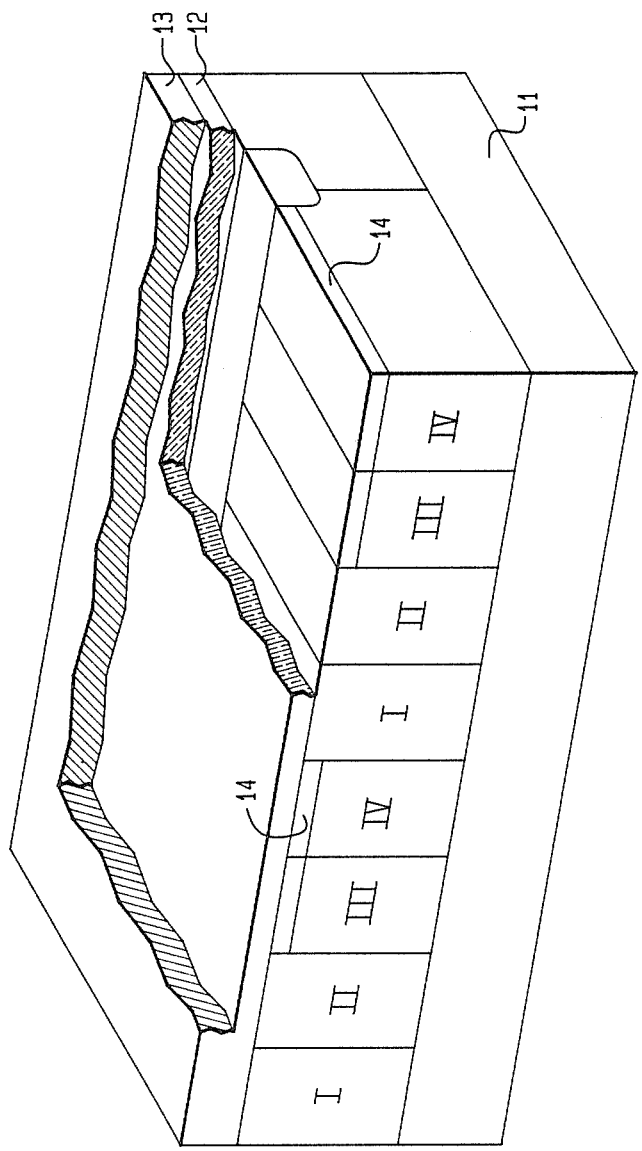
FIG. 1 is a perspective view with cutaway portions in cross section, taken both longitudinally of and normal to the channel region of a uniphase CCD of the kind to which the method of the invention is applicable.

FIG. 1 is a perspective view of the uniphase CCD of the kind to which the invention is applicable. It includes a monocrystalline silicon substrate 11. The upper surface of the substrate is covered by a gate dielectric layer 12, typically of silicon oxide, having a uniform thickness extending along the length of the channel region. A continuous gate electrode 13 extends along the length of the channel region and is connected to a clock pulse source (not shown). Spaced along the length of the channel is a series of cells, of which only two are shown. Each cell includes four sections labelled I, II, III and IV. A surface inversion layer 14 extends over the upper surface of sections III and IV of each cell. This acts as a virtual electrode, shielding those sections of each cell from any gate-induced change in potential. Just below the inversion layer, the channel potential maxima of sections III and IV are determined solely by the concentration of acceptor and donor ions in such sections. Each cell also includes region I and II wherein the potential maxima are determined both by the potential applied to the gate 13 and the concentration of acceptor ions in sections I and II.

By varying the potential applied to the gate 13, the potential maxima of sections I and II can be varied to be both higher and lower than the fixed potential maxima of sections III and IV whereby there may be achieved the desired gradient in potential profile to ensure charge transport undirectionally in the channel region from left to right as the gate potential is pulsed between high and low values by the clock source.

The CCD also includes an input structure at one end of the channel and an output structure at the other end of the channel for inputting and outputting signal charge packets for travel along the channel, neither of which is shown here.

The cross section of FIG. 1, which extends normal to the channel, includes a channel stop defining one of the lateral boundaries of the charge transfer channel. Typically a CCD area imager includes a plurality of parallel channels in a common substrate, each electrically isolated from one another by such intermediate channel stops.

Additionally, in a buried channel CCD, the charge transfer occurs in a channel formed just below the upper surface of the substrate.

For a more detailed description of the operation of such a uniphase CCD, reference is made to the aforementioned U.S. Pat. No. 4,229,752.

Figure 2:
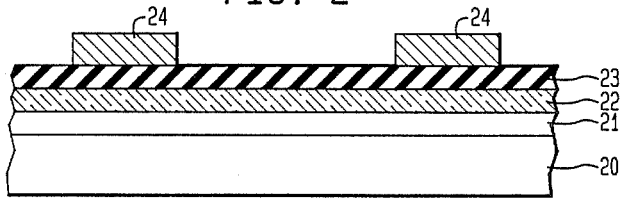
FIGS. 2-6 illustrate the sequence of processing steps in the manufacture of a CCD of FIG. 1 in accordance with the invention.

With reference now to FIG. 2, there will be described a fabrication process illustrative of the invention for achieving the desired impurity concentrations in the various sections of each cell.

First, there is prepared a monocrystalline silicon substrate of a suitable uniform impurity concentration. In an illustrative example, the substrate was initially doped to a concentration of about $2.5 \times 10^{14}$ donors/cm$^3$.

Next, there is an unselective implant of acceptor ions, typically of boron of a dosage of about $4.7 \times 10^{11}$ ions/cm$^2$ at a voltage of about 110 KEV, through a pad silicon oxide of about 800 Angstroms to form a p-type buried channel 21 just below the upper surface of the substrate 20 in which the charge transfer is to occur. After removal of this pad oxide, there is then grown in turn over the substrate the gate oxide layer 22 and a layer 23 suitable for use as an etch stop later, typically of silicon nitride. The thickness of the silicon oxide layer is a parameter that is important in the operating design and in the specific illustrative embodiment being described was about 600 Angstroms thick. The thickness of the silicon nitride in this embodiment was about 250 Angstroms thick. Standard techniques can be used for the deposition of these layers.

Next, there was deposited over the substrate a layer of polysilicon, in known fashion using chemical vapor deposition, of a thickness of about one micron. This was then patterned in known fashion, for example, using photolithographic techniques and anisotropic etching, to form strips with vertical side walls about 6 microns wide, spaced apart edge-to-edge about 8 microns. The resultant is seen in FIG. 2. The n-type silicon substrate 20 includes the boron-rich channel 21 over which lies the silicon oxide layer 22, silicon nitride layer 23 and the polysilicon layer patterned into strips 24.

Figure 3:
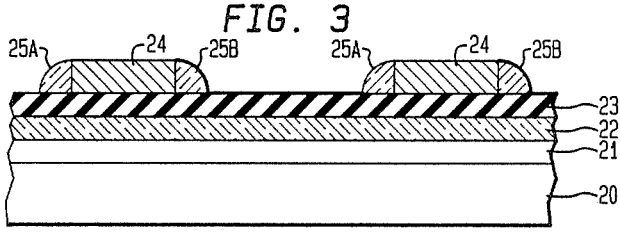

Next there is formed over the side edges of each polysilicon strip 24, side wall spacers 25A, 25B, as seen in FIG. 3, of a material with etching characteristics different from those strips 24, for example, silicon oxide. These can be formed in known fashion, for example, by depositing conformally over strips 24 a layer of silicon oxide about one micron thick and then isotropically etching to remove the oxide deposited on the broad surface of the strip, leaving oxide portions along the side edges of the strip as shown. The width of the spacer portion is essentially determined by the thickness of the oxide layer deposited and essentially corresponds to such thickness if over-etching is avoided. Significantly, the width of this spacer can be controlled independently of any photolithographic step, which is an important advantage, since it makes possible spacer widths narrower than the resolution and alignment capabilities of the photolithographic equipment available.

At this stage, the substrate is exposed to a second boron implantation step, illustratively to a dosage of $1.75 \times 10^{12}$ ions/cm$^2$ again at a voltage of 110 KEV.

Figure 4:
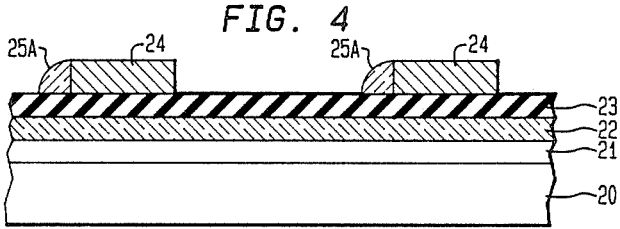

Next, as seen in FIG. 4, the right-most spacer 25B is selectively removed from each strip 24. This can be done in any suitable fashion, as for example, by covering the surface with a photoresist, selectively removing the portions of the photoresist overlying the right-most portion of each strip to expose the right-most spacers, and then etching away the right-most spacers.

After removal of the right-most spacers, the substrate is subjected to two separate implantations, the order of which is not critical.

One is a shallow implantation of donor ions, advantageously arsenic, to form the inversion layers to serve as the virtual electrodes, as previously discussed. In the particular embodiment being described, the dosage was $1.4 \times 10^{13}$ ions/cm$^2$ at a voltage of 240 KEV. Because of the much larger mass of the arsenic ion, its depth of implantation will be shallower than that of the boron ion despite the higher accelerating voltage.

The second implantation is of boron with a dosage of $1.6 \times 10^{12}$ ions/cm$^2$ at a voltage of 110 KEV.

Figure 5:
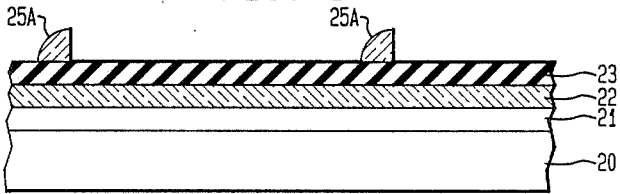

Next, there are etched away selectively the polysilicon strips 24 leaving only the side wall spacers 25A, as seen in FIG. 5. At this stage there is a final boron implant at $6.7 \times 10^{11}$ ions/cm$^2$ dosage and 110 KEV voltage.

Figure 6:
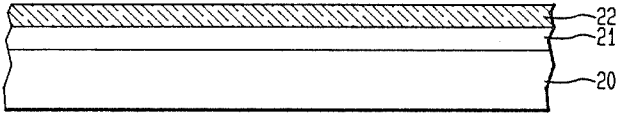

Finally, there is etched away the oxide spacers 25A and the silicon nitride layer 23 to leave only the implanted substrate 20 covered with the gate oxide 22 as seen in FIG. 6.

It is generally desirable before deposition of the gate electrode to reheat the substrate, for example, to 950 degrees Centigrade in oxygen for 10 minutes to repair any damage to the gate oxide. This heating also can serve to activate the implanted ions, although a separate annealing step may sometimes be preferred.

Figure 7:
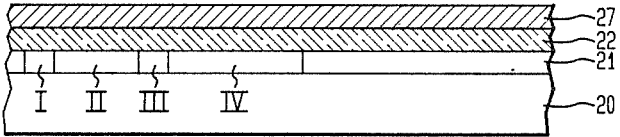

Then there can be deposited over the gate oxide the gate electrode 27 as seen in FIG. 7. Typically, the gate electrode in a CCD is a polysilicon layer several thousand Angstroms thick and doped to be of high conductivity. However, in a uniphase CCD, because only one level of metallization is required, it is feasible to employ as the gate conductor a material such as tin-doped indium oxide, which can be transparent. This poses advantages when the CCD is to be used in some form of imaging devices, such as the frame transfer type.

In FIG. 7, there also is shown one cell of the buried channel layer 21 divided into its four component sections. Section I is defined by spacer 25A and has relatively light boron-implantation. Section II is defined by strip 24 which has a heavier boron-implantation. Section III is defined by spacer 25B which has a still heavier boron-implantation compensated in part by an arsenic implantation. Section IV is defined by the bare region between spacers 25B and 25A in FIG. 3 and has the heaviest boron concentration compensated in part by the arsenic implantation.

An advantage of this process is that it permits Sections I and III, which can be arranged to serve as the transfer sections to be relatively narrow, since defined by the spacers 25A and 25B whose widths are not limited by photolithography. This allows Sections II and IV, which then are the storage sections, to be relatively wider, as is desirable to increase their storage capacity and thereby to minimize saturation effects.

The remaining steps of the process of manufacture of a complete CCD can be conventional and so will not be discussed here.

It is to be understood that the specific values mentioned are merely illustrative of one design, intended for use with about a four-volt clock voltage for charge transfer. Other designs would use other values of dosage and accelerating voltages for the implanted ions. Similarly, other thicknesses and widths of the masking layer may be desirable for other designs. Similarly, other combinations of materials can be used in the composite mask. For example, aluminum may be deposited and suitably patterned and selective portions oxidized to form the spacer portions, leaving unoxidized aluminum to serve as the central portion. Polycrystalline silicon can be used in a similar fashion. Similarly, as is well known, the polarities of the device can be reversed by reversing the sign of the ions and the conductivity-type of the starting material. Similarly, other ions could be substituted for the specific ones mentioned.

Additionally, if a surface channel form of CCD is desired instead of a buried channel form, there may be omitted the initial nonseletive implant used to form the buried channel.

Similarly, it is feasible to omit including the gate oxide layer initially but rather to form the gate oxide layer just before deposition of the gate electrode. However, it is generally advantageous to include an oxide layer between the silicon substrate and a deposited silicon nitride layer to improve the properties of the silicon nitride layer for use as an etch stop. Moreover, the thickness of the nitride layer should be sufficient to serve as a reliable etch stop, but should not be so thick as to impede significantly the passage therethrough of the implanted ions.

The invention has been described in detail with particular reference to preferred embodiments thereof, but it will be understood that variations and modifications can be effected within the spirit and scope of the invention.

What is claimed is:

1. In the manufacture of a uniphase charge coupled device, the process of providing a desired doping concentration in a semiconductive substrate for use in the charge-coupled device comprising the steps of:

forming over the substrate a mask including a plurality of strip portions, each including a central portion of one material with vertical side walls and edge portions of a different material on opposite side walls of the central portion;

implanting ions of one type through the mask into exposed regions of the substrate;

removing corresponding ones of the edge portions of each strip;

implanting ions of both the one and the opposite types into the exposed region of the substrate;

removing the central portion of each strip;

implanting ions of the one type into exposed regions of the substrate; and removing the remaining edge portion of each strip.

2. The process of claim 1 in which the mask strips include a central portion of polysilicon and edge portions of silicon oxide and the substrate includes an etch-stop layer of silicon nitride between the surface of the substrate and the strips of the mask.

3. The process of claim 1 in which the substrate is n-type and includes a surface layer of implanted boron and the implanted ions of the opposite type are of arsenic.

4. The process of providing a substrate for use in a buried channel uniphase charge-coupled device comprising the steps of:

preparing an n-type silicon substrate;

implanting boron ions into the upper surface of the substrate for forming a boron-rich upper surface layer;

forming in turn a silicon oxide layer and a silicon nitride layer over the upper surface layer of the substrate;

forming a mask over the silicon nitride layer including a plurality of spaced strips, each including a polysilicon central portion having an opposed pair of vertical side walls and a separate silicon oxide edge portions on each of the two side walls of each central portion;

implanting through the mask exposed regions of the substrate with boron ions;

removing selectively the silicon oxide edge portions from the corresponding ones of the side walls of the strips of the mask;

implanting through the mask boron and arsenic ions into exposed regions of the substrate;

removing selectively the central portions of each strip and leaving only the remaining edge portion of each strip of the mask; and implanting through the mask boron ions into the exposed regions of the substrate.

* * * * *